(12) United States Patent
Ishida

(10) Patent No.: US 9,433,106 B2
(45) Date of Patent: Aug. 30, 2016

(54) METHOD FOR MANUFACTURING PRINTED WIRING BOARD

(71) Applicant: IBIDEN Co., Ltd., Ogaki-shi (JP)

(72) Inventor: Naoto Ishida, Ogaki (JP)

(73) Assignee: IBIDEN Co., Ltd., Ogaki-shi (JP)

(*) Notice: Subject to any disclaimer, the term of this patent is extended or adjusted under 35 U.S.C. 154(b) by 229 days.

(21) Appl. No.: 13/948,642

(22) Filed: Jul. 23, 2013

(65) Prior Publication Data
US 2014/0026412 A1 Jan. 30, 2014

(30) Foreign Application Priority Data

Jul. 27, 2012 (JP) .................................. 2012-166718

(51) Int. Cl.
| | |
|---|---|
| H05K 3/20 | (2006.01) |
| H05K 3/40 | (2006.01) |
| H05K 3/10 | (2006.01) |
| H01L 23/498 | (2006.01) |
| H05K 3/46 | (2006.01) |
| H01L 21/48 | (2006.01) |

(52) U.S. Cl.
CPC ....... H05K 3/4038 (2013.01); H01L 23/49822 (2013.01); H01L 23/49827 (2013.01); H05K 3/10 (2013.01); H05K 3/4602 (2013.01); H01L 21/486 (2013.01); H01L 21/4857 (2013.01); H01L 2924/0002 (2013.01); H05K 3/4682 (2013.01); H05K 2201/096 (2013.01); H05K 2201/09509 (2013.01); H05K 2201/09563 (2013.01); Y10T 29/49155 (2015.01); Y10T 29/49165 (2015.01)

(58) Field of Classification Search
CPC .. H05K 3/0094; H05K 3/0097; H05K 3/025; H05K 3/4038; H05K 3/429; H05K 3/4602; H05K 3/4682; H05K 3/462; H05K 3/4623; H01L 21/4857; H01L 21/486; H01L 23/49822; H01L 23/49827; Y10T 29/49126; Y10T 29/49128; Y10T 29/49155; Y10T 29/49162; Y10T 29/49165; Y10T 29/49208
USPC ................ 29/831, 832, 842, 846, 852, 866; 216/63; 174/254, 255, 256, 259
See application file for complete search history.

(56) References Cited

U.S. PATENT DOCUMENTS

| | | | | | |
|---|---|---|---|---|---|
| 5,746,868 | A | * | 5/1998 | Abe | .......................... B22F 7/08 156/247 |
| 5,841,075 | A | * | 11/1998 | Hanson | ................. H01L 21/486 174/250 |
| 6,143,116 | A | * | 11/2000 | Hayashi | .................. B32B 37/18 156/233 |
| 6,571,467 | B2 | * | 6/2003 | Haze | ...................... H05K 3/385 174/262 |
| 6,766,576 | B2 | * | 7/2004 | Haze | ...................... H05K 3/385 174/262 |
| 6,994,414 | B2 | * | 2/2006 | Hashimoto | .............. B41J 3/407 257/E21.174 |
| 7,223,687 | B1 | * | 5/2007 | Ho | ....................... H05K 3/0058 29/829 |

(Continued)

FOREIGN PATENT DOCUMENTS

JP         2010-232414 A        10/2010

*Primary Examiner* — Paul D Kim

(74) *Attorney, Agent, or Firm* — Oblon, McClelland, Maier & Neustadt, L.L.P

(57) ABSTRACT

A method for manufacturing a printed wiring board includes forming on a support sheet an intermediate body including a first insulation layer, a second insulation layer and a first conductive layer interposed between the first insulation layer and the second insulation layer, and separating the support sheet from the intermediate body including the insulation layer, the first conductive layer and the second insulation layer such that the intermediate body is detached from the support sheet.

20 Claims, 13 Drawing Sheets

(56) References Cited

U.S. PATENT DOCUMENTS 8,510,936 B2 * 8/2013 Chuang ............... H05K 3/0097
                                                    29/831

8,959,760 B2 * 2/2015 Niki .................... H05K 3/0058
                                                    174/255

9,066,459 B2 * 6/2015 Tateoka ................ H05K 3/022

* cited by examiner (A)

(B)

(A)

(B)

(A)

(B)

periphery of alignment mark

METHOD FOR MANUFACTURING PRINTED WIRING BOARD

CROSS-REFERENCE TO RELATED APPLICATIONS

The present application is based upon and claims the benefit of priority to Japanese Patent Application No. 2012-166718, filed Jul. 27, 2012, the entire contents of which are incorporated herein by reference.

BACKGROUND OF THE INVENTION

1. Field of the Invention

The present invention relates to a method for manufacturing a printed wiring board by using a support sheet.

2. Description of Background Art

In Japanese Laid-Open Patent Publication No. 2010-232414, it is described that a printed wiring board is manufactured by using a transport apparatus. Also, in paragraph 17 of Japanese Laid-Open Patent Publication No. 2010-232414, it is described that if the thickness of a substrate is 0.3 mm or less, placing the substrate into a solder printing apparatus is difficult. A thin substrate is placed in the apparatus by retaining it with a jig in Japanese Laid-Open Patent Publication No. 2010-232414. The entire contents of this publication (these publications) are incorporated herein by reference.

SUMMARY OF THE INVENTION

According to one aspect of the present invention, a method for manufacturing a printed wiring board includes forming on a support sheet an intermediate body including a first insulation layer, a second insulation layer and a first conductive layer interposed between the first insulation layer and the second insulation layer, and separating the support sheet from the intermediate body including the insulation layer, the first conductive layer and the second insulation layer such that the intermediate body is detached from the support sheet.

According to another aspect of the present invention, a method for manufacturing a printed wiring board includes forming on a support sheet an intermediate body including a first conductive layer, a second conductive layer, a third conductive layer, a first insulation layer and a second insulation layer such that the second conductive layer is formed on the support sheet, the first insulation layer is formed on the support sheet and the second conductive layer, the first conductive layer is formed on the first insulation layer, the second insulation layer is formed on the first insulation layer and the first conductive layer, and the third conductive layer is formed on the second insulation layer, and separating the support sheet from the intermediate body including the first conductive layer, the second conductive layer, the third conductive layer, the first insulation layer and the second insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
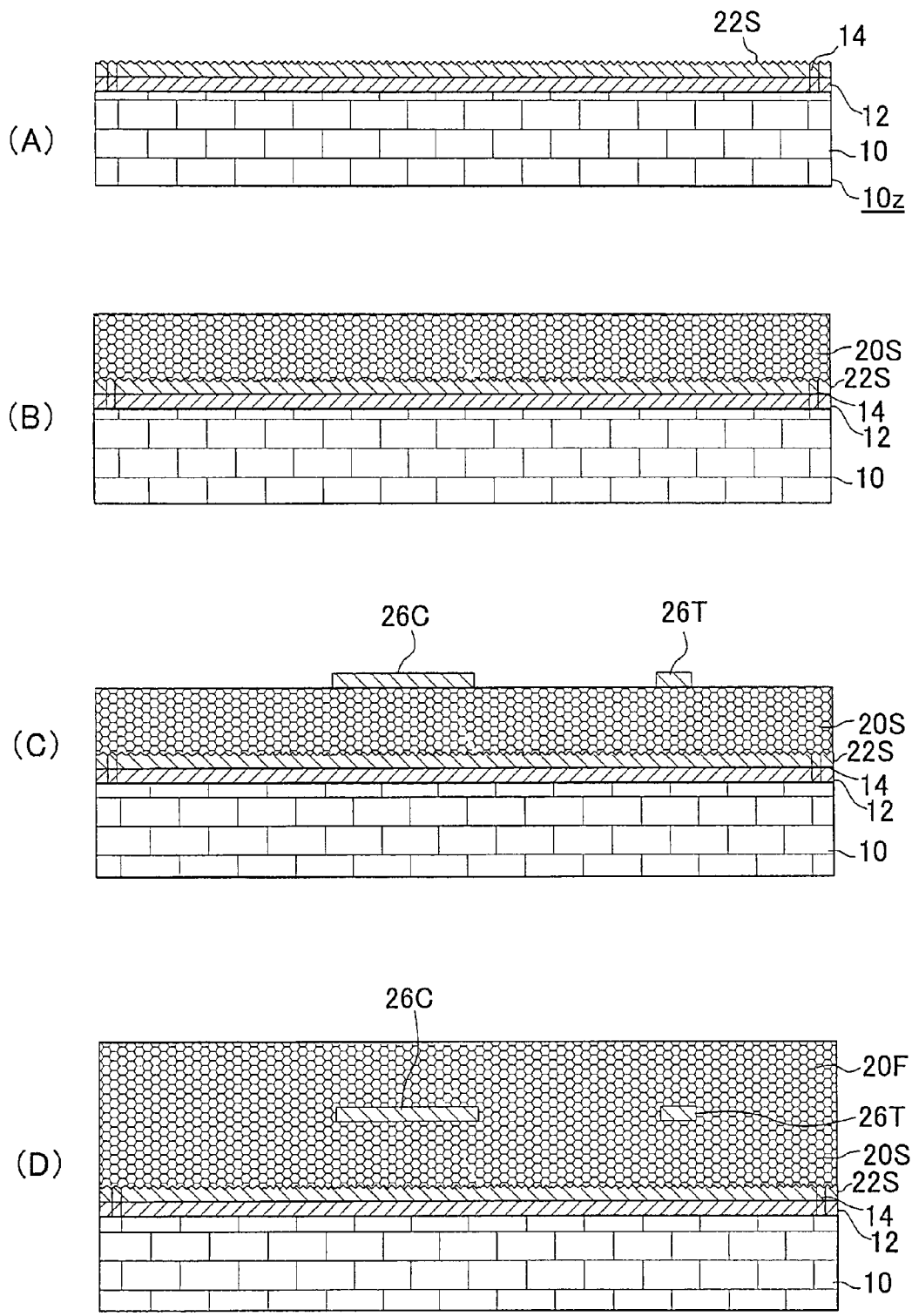
FIGS. 1(A)-1(D) are views of steps showing a method for manufacturing a printed wiring board according to a first embodiment of the present invention.
Figure 2:
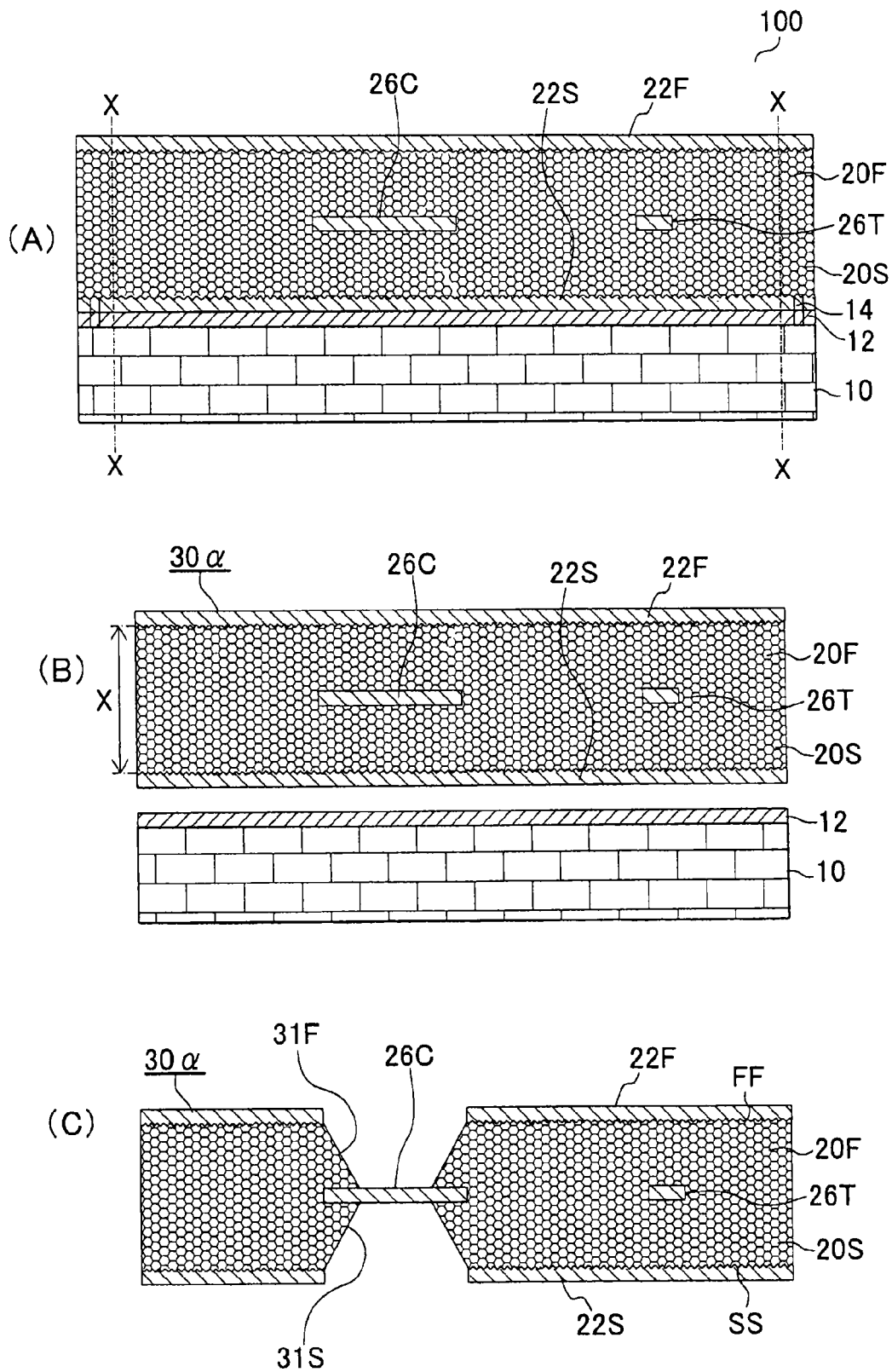
FIGS. 2(A)-2(C) are views of steps showing the method for manufacturing a printed wiring board according to the first embodiment.
Figure 3:
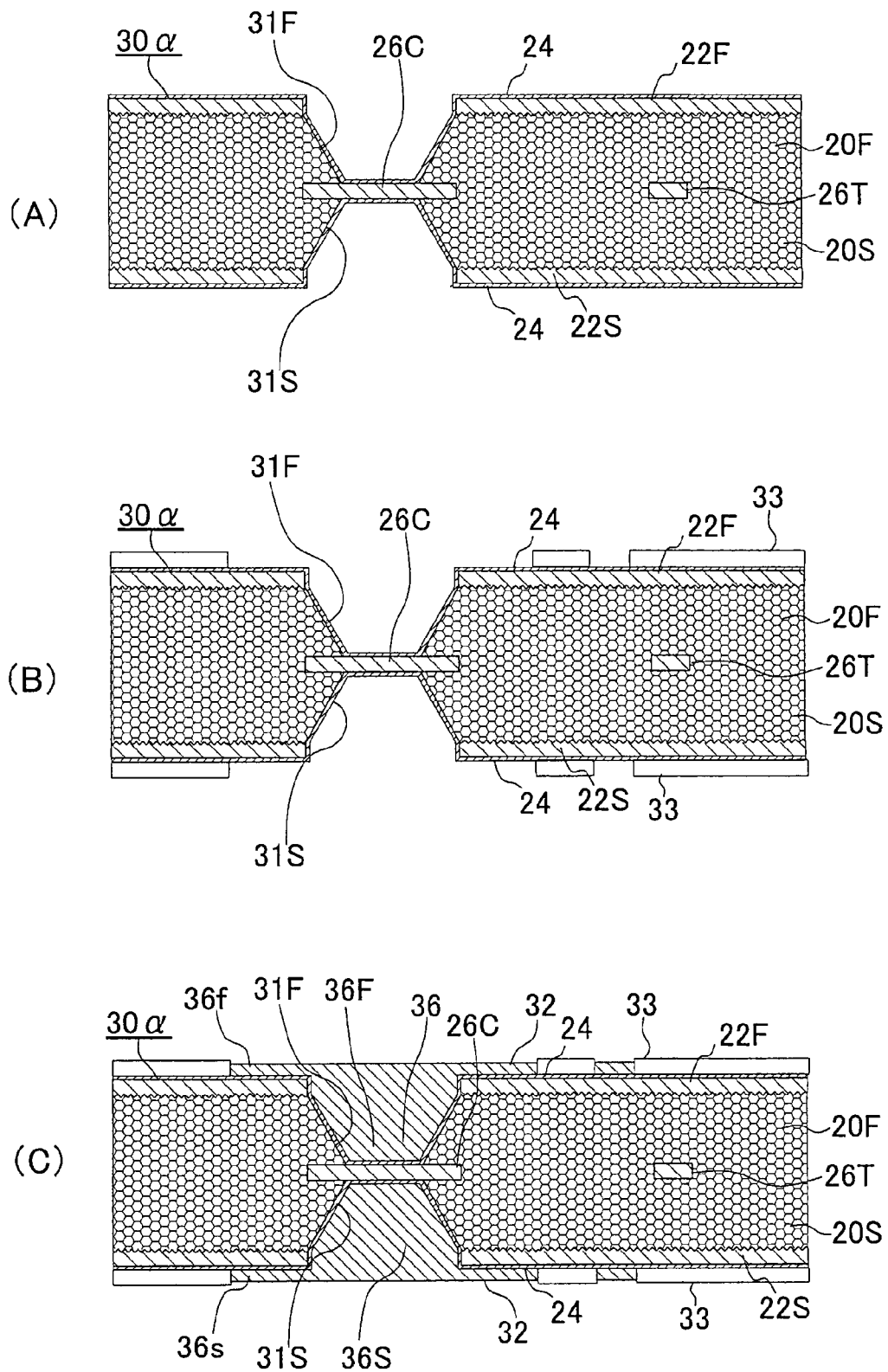
FIGS. 3(A)-3(C) are views of steps showing the method for manufacturing a printed wiring board according to the first embodiment.
Figure 4:
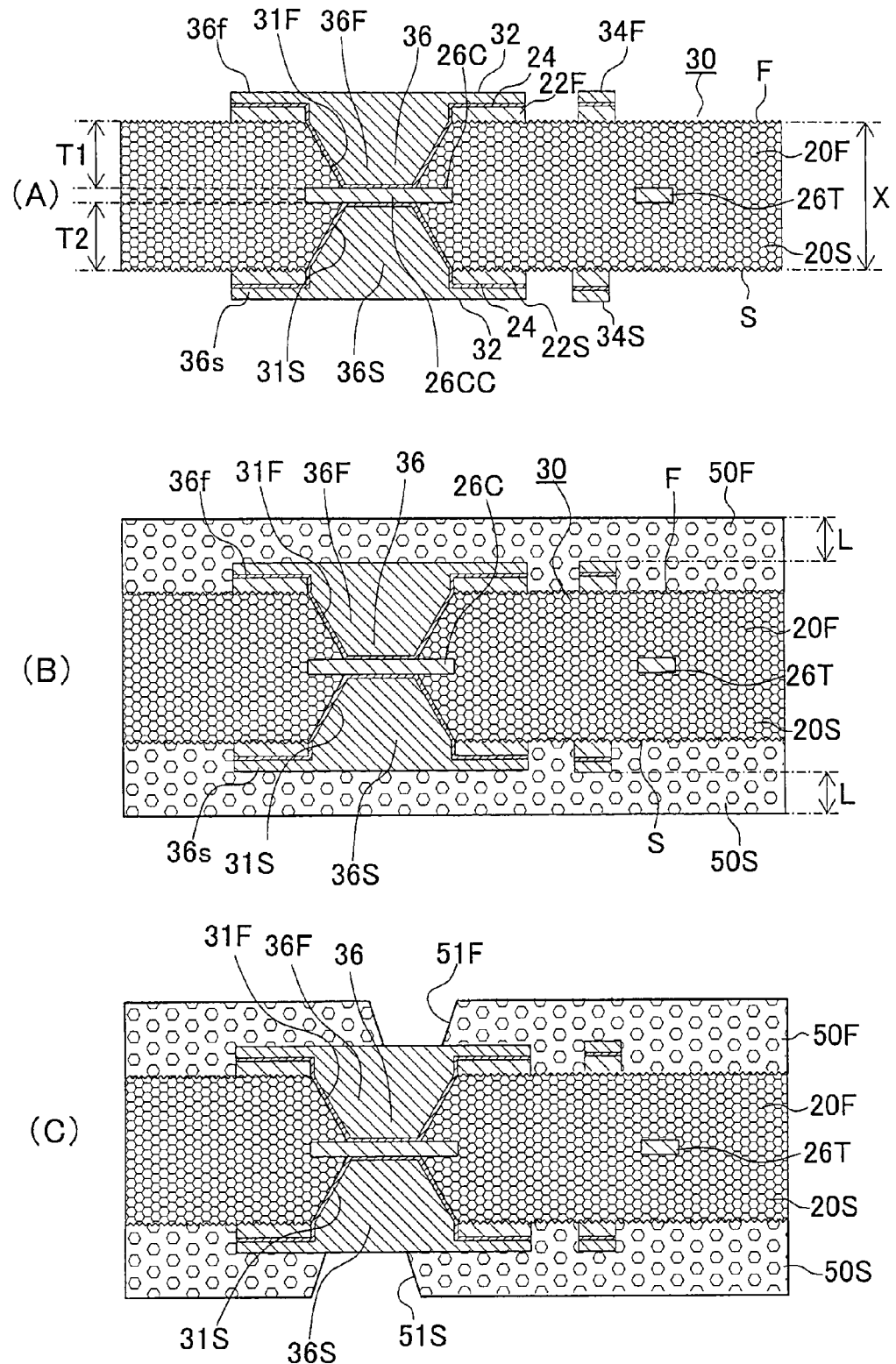
FIGS. 4(A)-4(C) are views of steps showing the method for manufacturing a printed wiring board according to the first embodiment.
Figure 5:
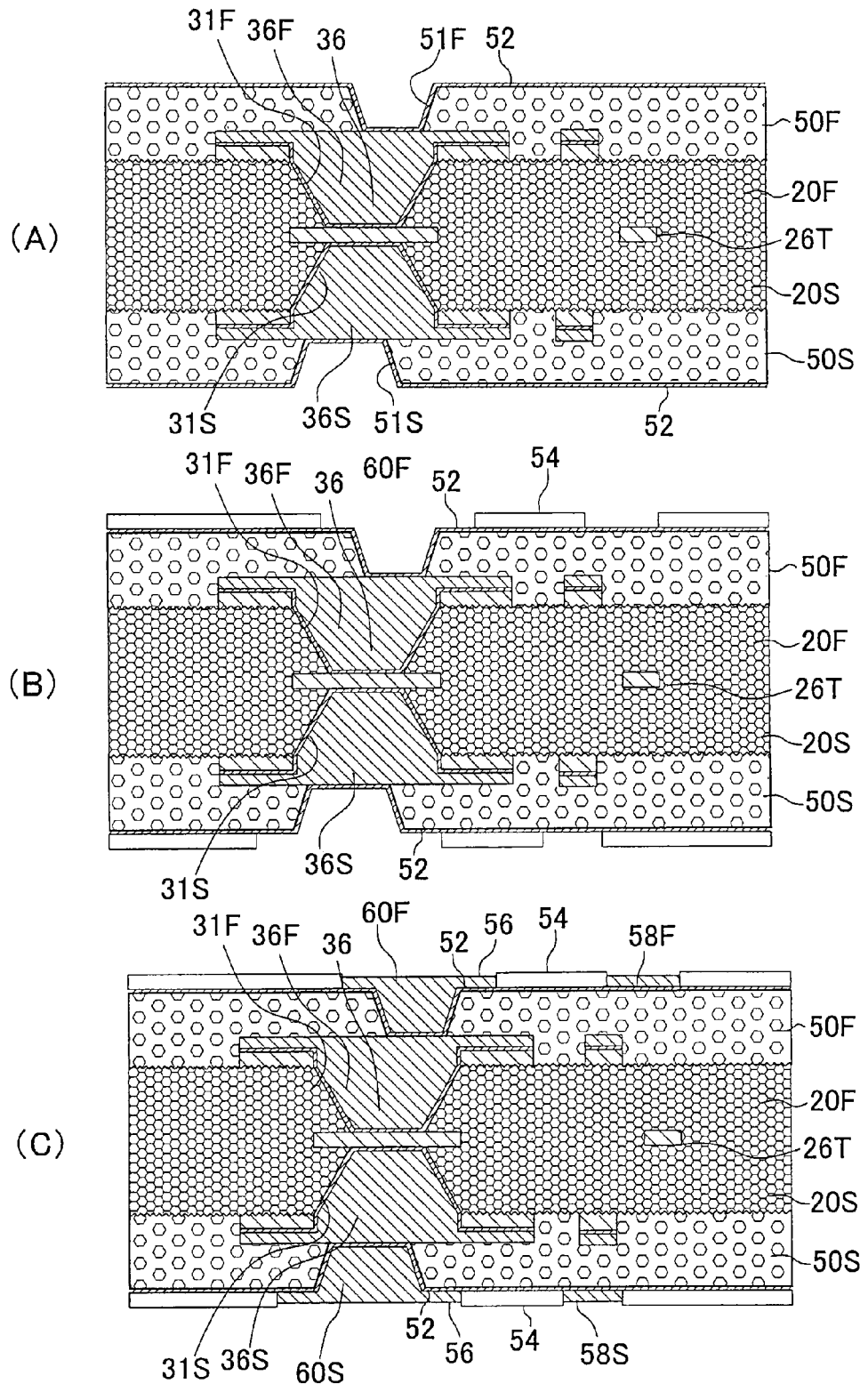
FIGS. 5(A)-5(C) are views of steps showing the method for manufacturing a printed wiring board according to the first embodiment.
Figure 6:
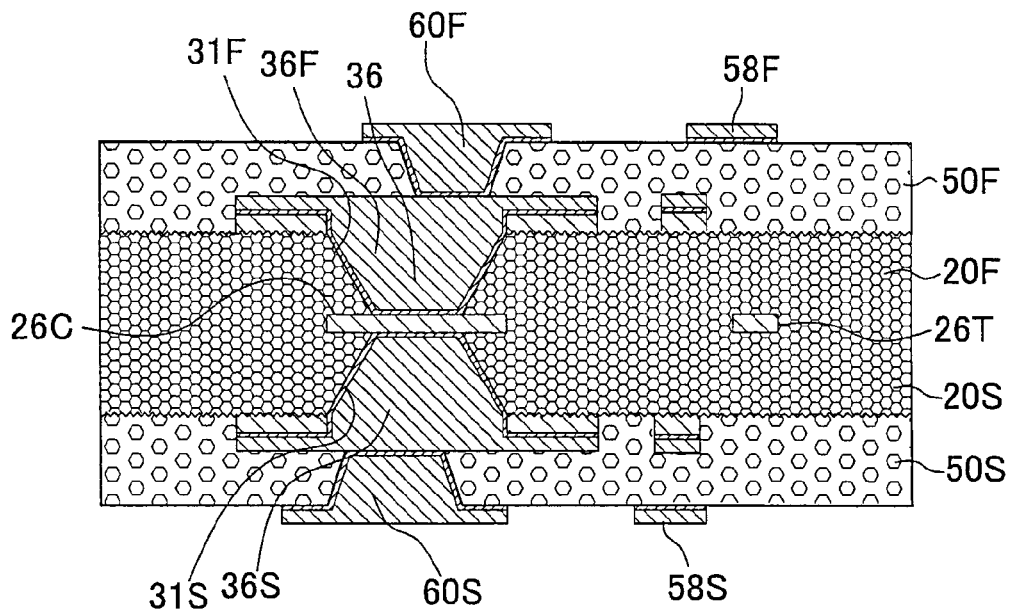
FIGS. 6(A)-6(B) are views of steps showing the method for manufacturing a printed wiring board according to the first embodiment.
Figure 6:
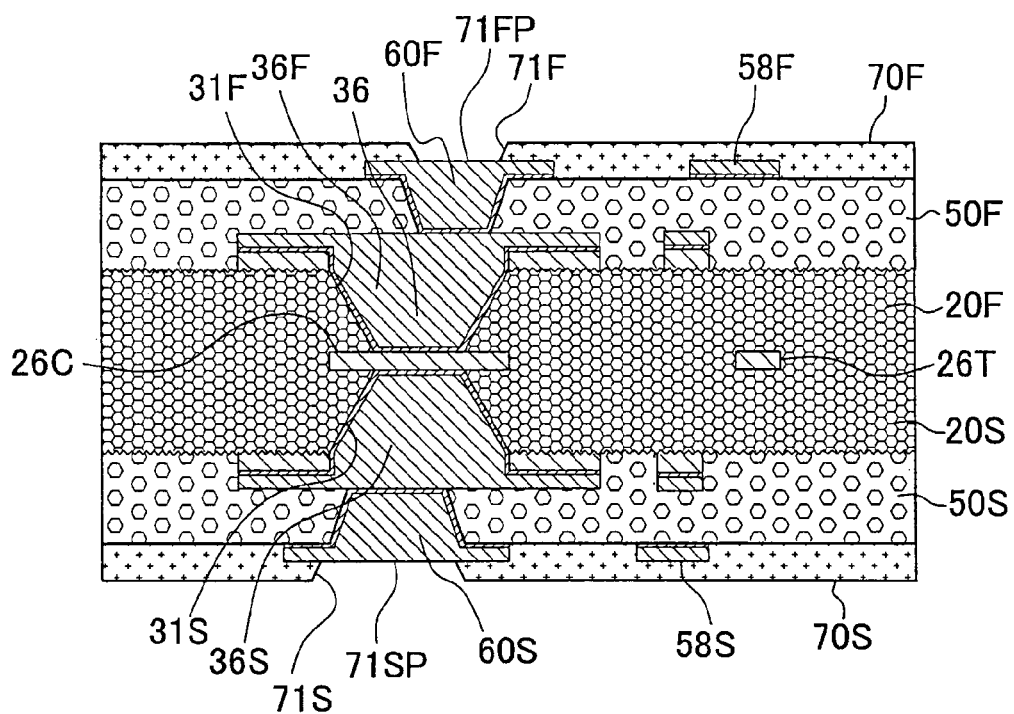
Figure 7:
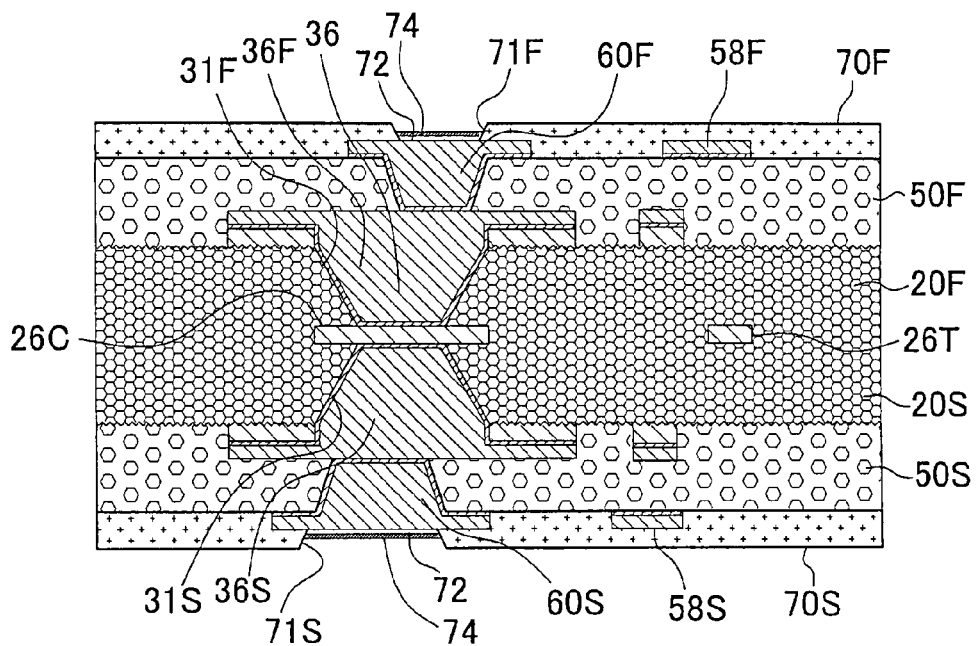
FIGS. 7(A)-7(B) are views of steps showing the method for manufacturing a printed wiring board according to the first embodiment.
Figure 7:
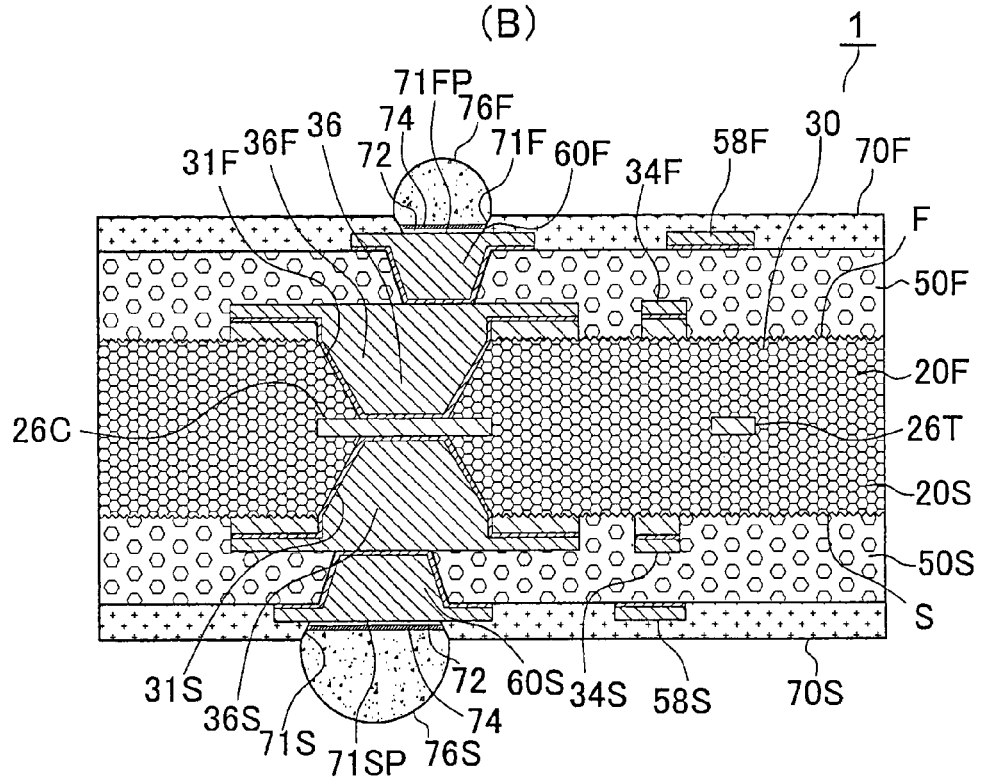
Figure 8:
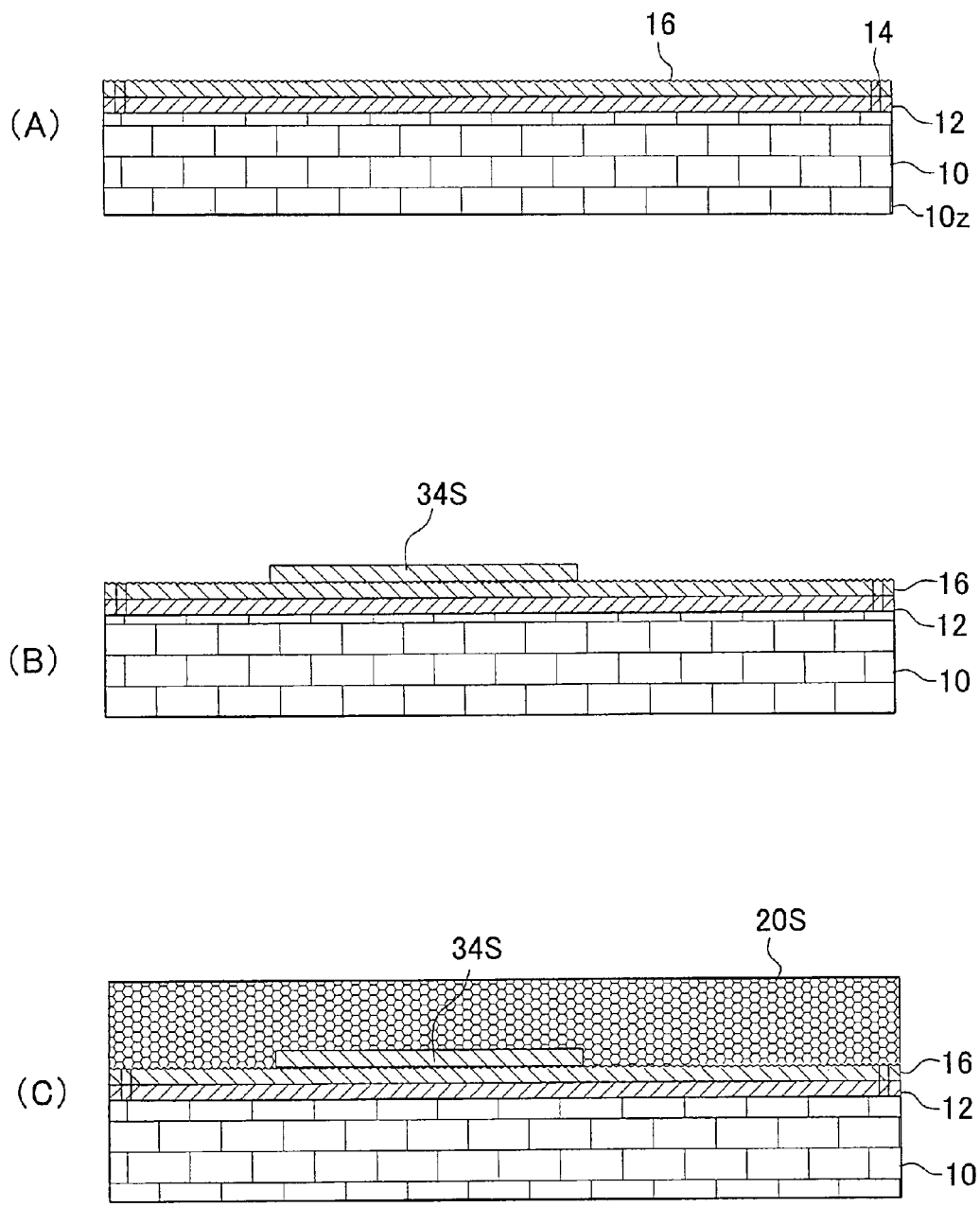
FIGS. 8(A)-8(C) are views of steps showing a method for manufacturing a printed wiring board according to a second embodiment.
Figure 9:
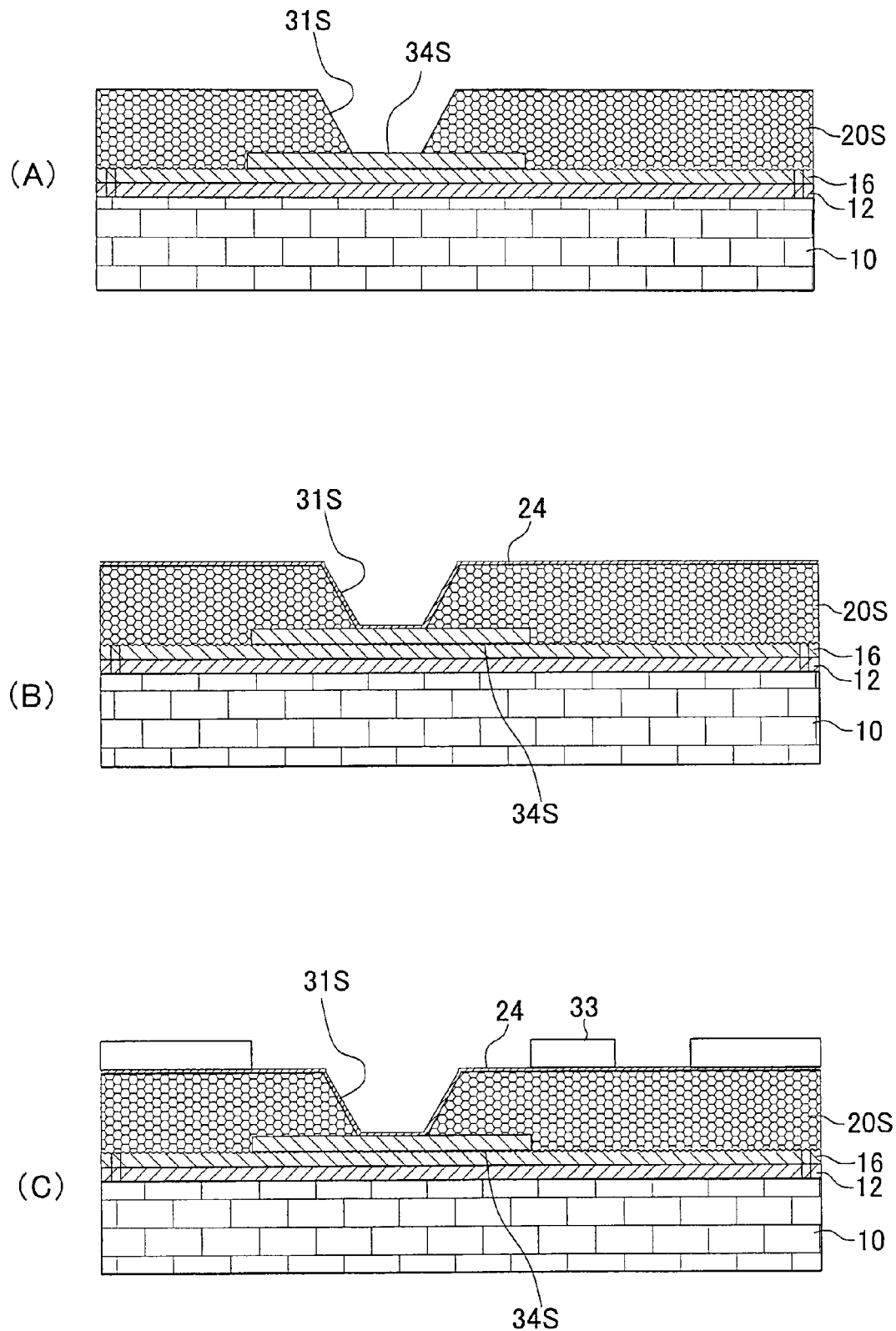
FIGS. 9(A)-9(C) are views of steps showing the method for manufacturing a printed wiring board according to the second embodiment.
Figure 10:
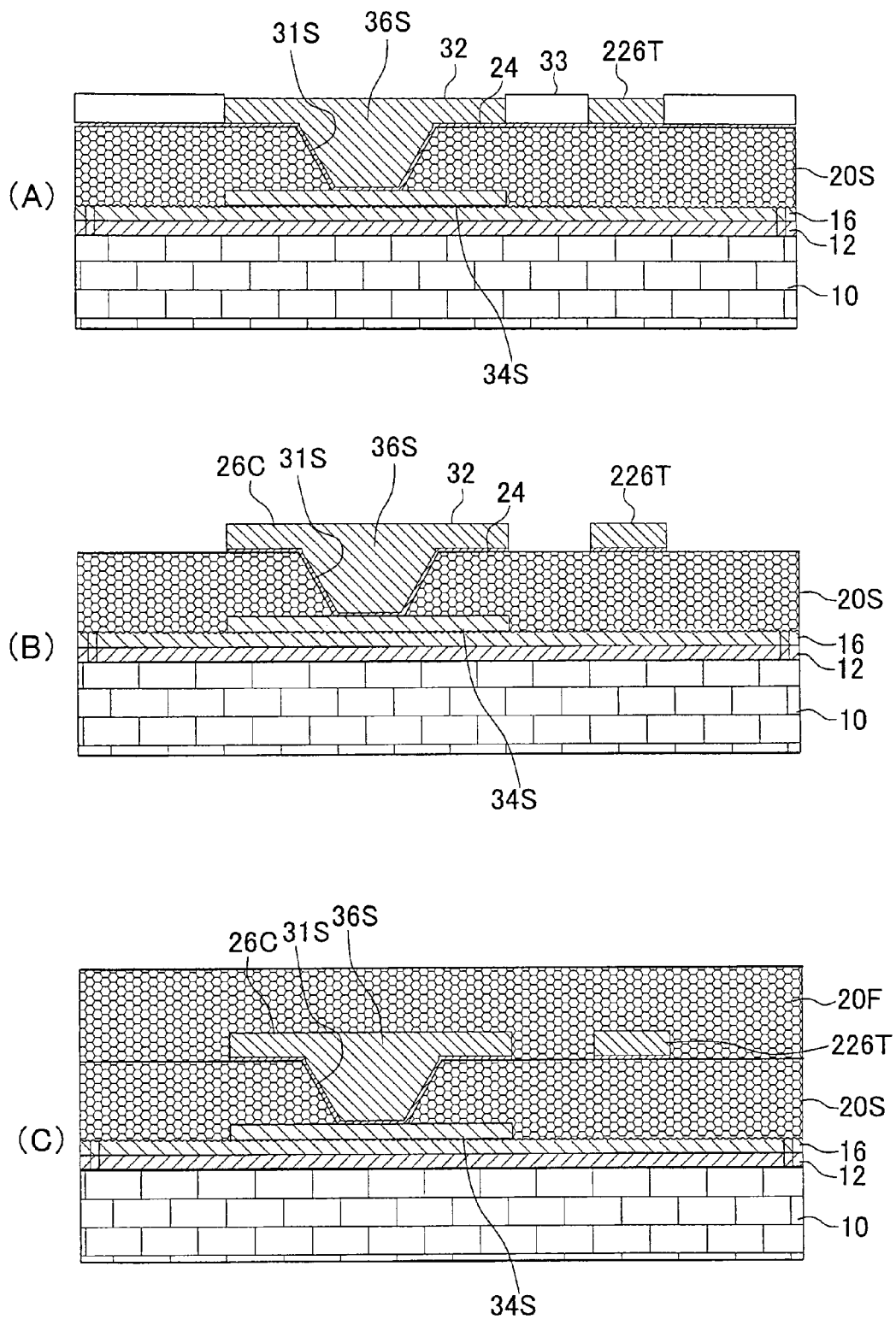
FIGS. 10(A)-10(C) are views of steps showing the method for manufacturing a printed wiring board according to the second embodiment.
Figure 11:
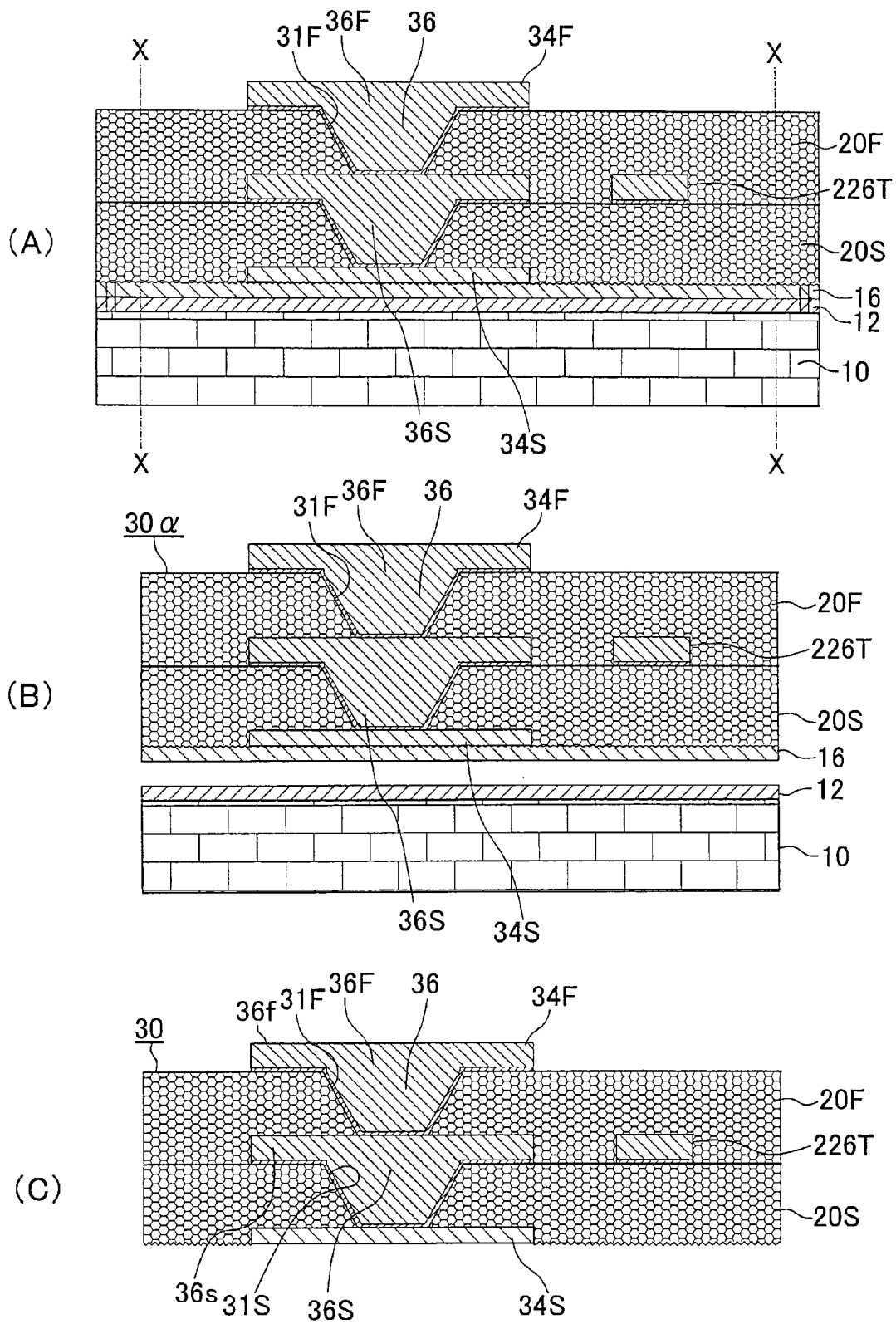
FIGS. 11(A)-11(C) are views of steps showing the method for manufacturing a printed wiring board according to the second embodiment.
Figure 12:
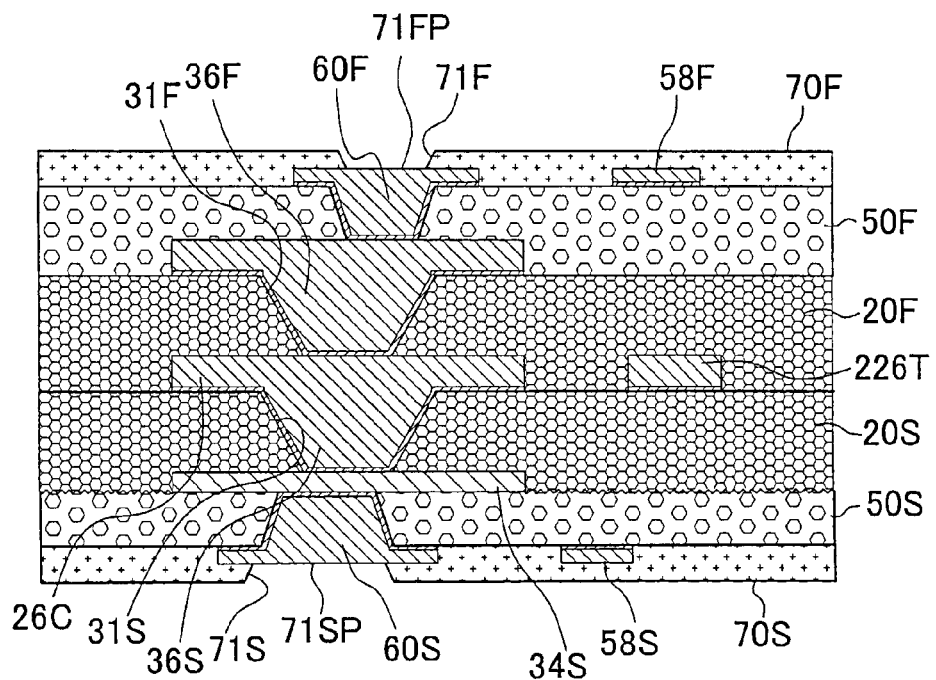
FIGS. 12(A)-12(B) are views of steps showing the method for manufacturing a printed wiring board according to the second embodiment.
Figure 12:
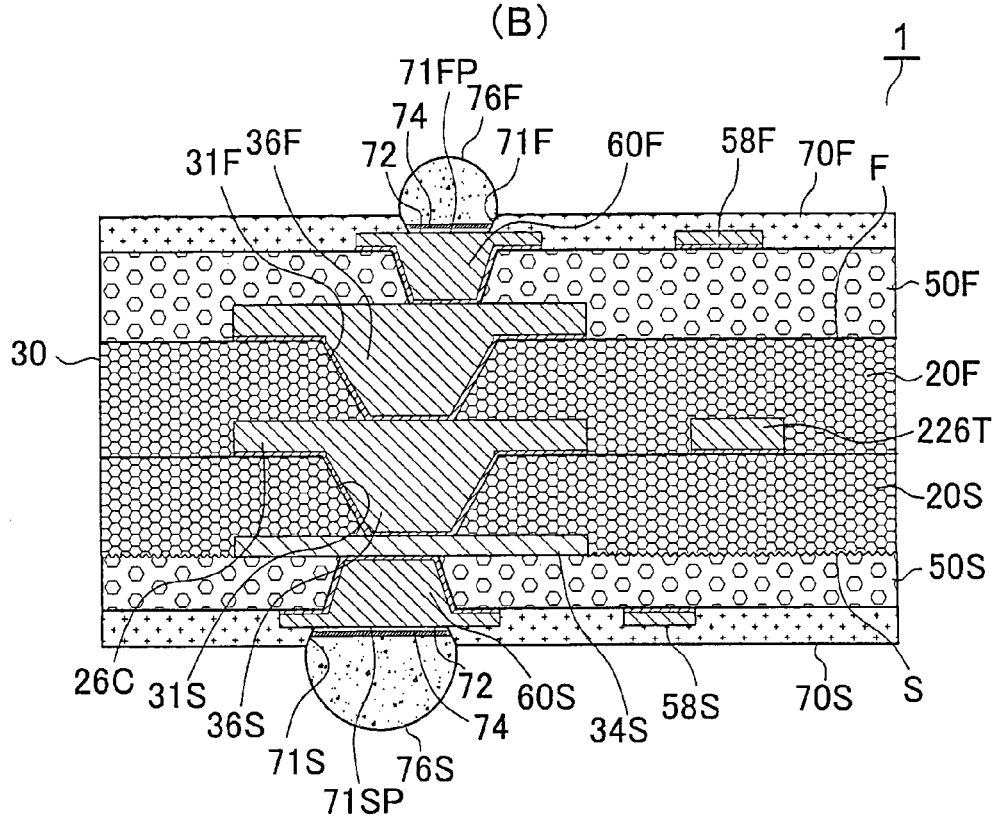

The embodiments will now be described with reference to the accompanying drawings, wherein like reference numerals designate corresponding or identical elements throughout the various drawings.

First Embodiment

FIG. 1~FIG. 7 show a method for manufacturing printed wiring board 1 according to a first embodiment.

(1) Support sheet 10 is prepared. For example, support sheet 10 is a copper-clad laminate (double-sided copper-clad laminate) made of insulative base (10z) and copper foil 12 laminated on both surfaces of insulative base (10z). The support sheet has a first surface and a second surface opposite the first surface. On the first surface of support sheet 10, metal foil (first metal foil) (22S) is laminated. Metal foil 22 is a copper foil, for example, and is 3 μm thick. Support sheet 10 and metal foil (22S) are fixed together on the periphery. The copper-clad laminate and the metal foil are ultrasonically bonded. The metal foil and the support sheet are bonded at fixed portions 14. The width of the fixed portions is a few millimeters. The fixed portions are formed into a frame shape (FIG. 1(A)). Metal foil (22S) has a matte surface (roughened surface). The metal foil is laminated on a support sheet in such a way that the matte surface does not face the support sheet. Here, copper foil and insulation layers are laminated on both surfaces of a double-sided copper-clad laminate in the actual manufacturing process. However, only one side is shown in the drawings.

(2) B-stage resin film is laminated on metal foil (first metal foil) (22S) (FIG. 1(B)). The matte surface of metal foil (22S) faces the first resin insulation layer. Then, resin film is cured and first resin insulation layer (first insulation layer) (20S) is formed on the support sheet. First resin insulation layer (20S) contains reinforcing material and/or inorganic particles. Examples of reinforcing material are glass cloth, aramid fiber, fiberglass and the like, for example. Glass cloth is preferred. Examples of inorganic particles are particles of silica, alumina, hydroxide and the like. As for hydroxides, metal hydroxides such as aluminum hydroxide, magnesium hydroxide, calcium hydroxide, barium hydroxide and the like are listed. When hydroxides are thermally decomposed, water is generated. Therefore, it is thought that hydroxides can rob heat from the material of insulation layers. Namely, when resin insulation layer (20S) contains a hydroxide, laser processing results are thought to improve. The first resin insulation layer has a first surface and a second surface opposite the first surface, and the second surface faces the matte surface of metal foil. The first insulation layer is formed on the support sheet. In the first embodiment, the first insulation layer is laminated on the support sheet with metal foil (22S) interposed in between.

(3) On the first surface of first resin insulation layer (20S), conductive layer (first conductive layer) (26C) is formed by a semi-additive method or tenting method (FIG. 1(C)). Conductive layer (26C) includes multiple conductive circuits and alignment marks (26T). The thickness of conductive layer (26C) is 5 μm to 15 μm.

(4) B-stage resin film is laminated on the first surface of first resin insulation layer (20S) and on conductive layer (26C). Then, the resin film is cured and second resin insulation layer (second insulation layer) (20F) is formed on the first resin insulation layer (FIG. 1(D)). Second resin insulation layer (20F) has a first surface and a second surface opposite the first surface. The first surface of the first resin insulation layer faces the second surface of the second resin insulation layer. The second resin insulation layer contains reinforcing material and inorganic particles the same as in the first resin insulation layer.

(5) Metal foil (second metal foil) (22F) is laminated on the first surface of second resin insulation layer (20F) (FIG. 2(A)). Substrate 100 shown in FIG. 2(A) is an intermediate body with the support sheet attached thereto. Intermediate body (30α) formed on the support sheet is made up of first resin insulation layer (20S) on the support sheet, first conductive layer (26C) on first resin insulation layer (20S), and second resin insulation layer (20F) on the first resin insulation layer and on conductive layer (26S). Such an intermediate body may also include metal foils (first and second metal foils) (22S, 22F) on both of its surfaces. Metal foil (22F) has a matte surface, which faces the first surface of the second resin insulation layer. The thickness of metal foil (22F) is 3 μm. Thicknesses of the first and second resin insulation layers are each 40 μm to 200 μm. Thicknesses (T1, T2) of resin insulation layers are each measured as the distance from the upper surface of a conductive layer to the upper surface of a resin insulation layer as shown in FIG. 4(A). To reduce the thickness of a printed wiring board, thicknesses of the first and second resin insulation layers are each preferred to be 80 μm or less. If the upper surface of a conductive layer is roughened, the thickness of a resin insulation layer is measured as the distance from the top end of the convex portions to the upper surface of the resin insulation layer.

(6) Along (X-X) lines in FIG. 2(A), the intermediate body with a support sheet is cut off. The portions to be cut are inside the fixed portions. Intermediate body (30α) is separated from support sheet 10 (FIG. 2(B)). When the thickness of the first resin insulation layer, the thickness of the second resin insulation layer, and the thickness of conductive layer (26C) interposed between the resin insulation layers are added, obtained value (X) is preferred to be 95 μm or greater. (X) is shown in FIG. 2(B) and FIG. 4(A).

Warping or undulation is small in the intermediate body even when it is separated from the support sheet. The thickness of the intermediate body is preferred to be 100 μm or greater. Defects are unlikely to occur during transportation. Since the intermediate body has two resin insulation layers and a conductive layer interposed between them, the intermediate body is processed without a support sheet. Even when the thickness of one resin insulation layer is thin, the intermediate body is processed without a support sheet. The thickness of the intermediate body is preferred to be 200 μm or less. The thickness of the printed wiring board decreases. Moreover, the thickness of the intermediate body is preferred to be 150 μm or less. A thin printed wiring board with less warping is provided.

Figure 13:
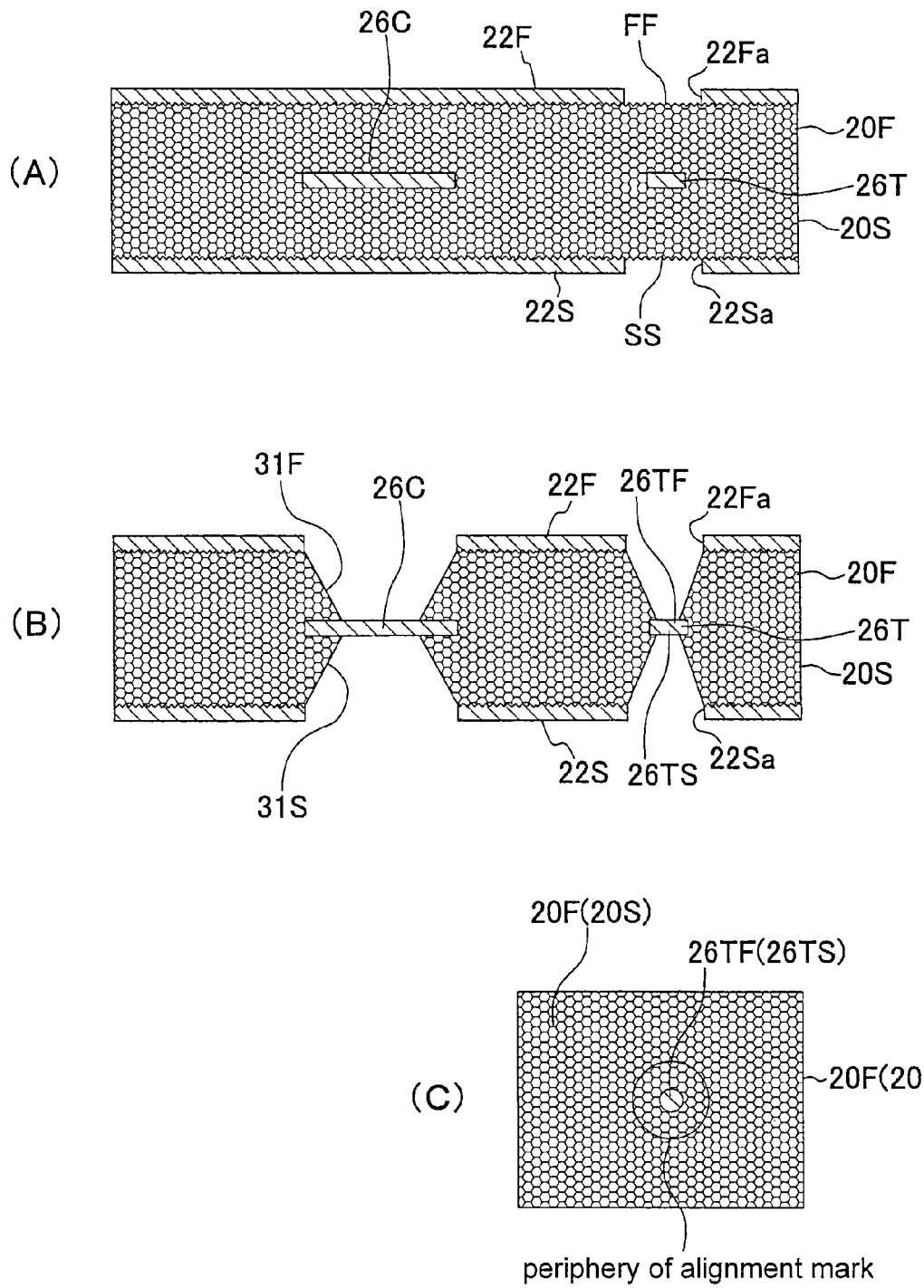
FIGS. 13(A)-13(C) are views of steps showing the method for manufacturing a printed wiring board according to the first embodiment.

(7) First metal foil (22S) and second metal foil (22F) which are positioned on alignment mark (26T) are removed (FIG. 13(A)). When resin insulation layers are permeable, the alignment mark is recognized through resin insulation layers. When resin insulation layers are not permeable, resin insulation layers on the alignment mark are removed (FIG. 13(B)). Upper surface (26TF) and lower surface (26TS) of the alignment mark are partially exposed. Resin insulation layers cover the periphery of the alignment mark (FIG. 13(C)). The upper surface of insulation layers and the alignment mark are shown in FIG. 13(C), omitting metal foils (22S, 22F). Based on alignment mark (26T), a laser is irradiated from the first-surface (upper-surface) (FF) side of intermediate body (30α). Second opening (31F) is formed in the second resin insulation layer, penetrating through second metal foil (22F) and the second resin insulation layer and reaching conductive layer (26C). Based on alignment mark (26T), a laser is irradiated from the second-surface (lower-surface) (SS) side of intermediate body (30a). First opening (31S) is formed in the first resin insulation layer, penetrating through first metal foil (22S) and the first resin insulation layer and reaching conductive layer (26C) (FIG. 2(C)). In such a case, the laser is directly irradiated on metal foils (22S, 22F). The first surface of the intermediate body corresponds to the first surface of the second resin insulation layer, and the second surface of the intermediate body corresponds to the second surface of the first resin insulation layer. Openings (31F, 31S) may also be formed by the following conformal masking method. Portions of the metal foils to form openings (31F, 31S) are removed, and a laser is irradiated using the metal foils as a mask so that openings (31F, 31S) are formed.

(8) Electroless plated film 24 is formed on first surface (FF) and second surface (SS) of intermediate body (30α) and on the inner walls of first opening (31S) and second opening (31F) (FIG. 3(A)). The material for electroless plated film 24 is copper, nickel or the like.

(9) Plating resist 33 with a predetermined pattern is formed on electroless plated film 24 (FIG. 3(B)).

(10) Electrolytic plated film 32 is formed on electroless plated film 24 using the electroless plated film as a seed layer. First opening (31S) and second opening (31F) are filled with electrolytic plated film (FIG. 3(C)).

(11) The plating resist is removed, and electroless plated film 24 and metal foils (22F, 22S) between portions of electrolytic plated film are removed. First via conductor (36S) is formed in first opening (31S), and second via conductor (36F) is formed in second opening (31F). In addition, third conductive layer (34F) is formed on first surface (FF) of the intermediate body, and second conductive layer (34S) is formed on second surface (SS) of the intermediate body. Accordingly, through-hole conductor 36 is formed by via conductor (36F), conductive circuit (26CC) in conductive layer (26C), and via conductor (36S). Third conductive layer (34F) and second conductive layer (34S) are connected by the through-hole conductor.

Core substrate (intermediate substrate) 30 is completed having the following (FIG. 4(A)): first conductive layer (26C); first and second resin insulation layers sandwiching first conductive layer (26C); second conductive layer (34S) on the second surface of the first resin insulation layer; third conductive layer (34F) on the first surface of the second resin insulation layer; first via conductor (36S) penetrating through the first resin insulation layer and connecting first conductive layer (26C) and second conductive layer (34S); and second via conductor (36F) penetrating through the second resin insulation layer and connecting third conductive layer (34F) and first conductive layer (26C). The intermediate substrate has two resin insulation layers, conductive layers interposed between those resin insulation layers and conductive layers on the upper and lower surfaces, allowing the intermediate substrate to be processed without using a support sheet. Even if the thickness of one resin insulation layer or the thickness of each conductive layer is thin, the intermediate substrate is processed without a support sheet.

In the first embodiment, openings and via conductors formed in the first resin insulation layer taper from the second surface of the first resin insulation layer toward conductive layer (26C). The diameter of a first via conductor on conductive layer (26C) is smaller than the diameter of the first via conductor on the second surface of the first resin insulation layer. In the first embodiment, openings and via conductors formed in the second resin insulation layer taper from the first surface of the second resin insulation layer toward conductive layer (26C). The diameter of a second via conductor on conductive layer (26C) is smaller than the diameter of the second via conductor on the first surface of the second resin insulation layer.

(12) Upper and lower interlayer resin insulation layers (50F, 50S) are formed on both surfaces (F,S) of core substrate 30 (FIG. 3(B)). Upper interlayer resin insulation layer (50F) is formed on the first surface of the second resin insulation layer and on third conductive layer (34F). Lower interlayer resin insulation layer (50S) is formed on the second surface of the first resin insulation layer and on second conductive layer (34S). The thickness of an interlayer resin insulation layer is 5 µm to 35 µm. Thickness (L) of an interlayer resin insulation layer is the distance measured from the upper surface of a conductive layer to the upper surface of the interlayer resin insulation layer (FIG. 4(B)). Upper and lower interlayer resin insulation layers contain inorganic particles or contain inorganic particles and reinforcing material.

(13) Next, using a CO2 gas laser, via-conductor openings (51F, 51S) are respectively formed in interlayer resin insulation layers (50F, 50S) (FIG. 4(C)).

(14) Electroless plated film 52 is formed on interlayer resin insulation layers (50F, 50S) and in openings (51F, 51S) (FIG. 5(A)).

(15) Plating resist 54 is formed on electroless plated film 52 (FIG. 5(B)).

(16) Electrolytic plated film 56 is formed on electroless plated film 52 exposed from plating resist 54 (FIG. 5(C)).

(17) Plating resist 54 is removed. By etching away electroless plated film between portions of electrolytic plated film, upper and lower conductive layers (58F, 58S) and upper and lower via conductors (60F, 60S) are formed (FIG. 6(A)). An upper buildup layer is made up of the upper interlayer resin insulation layer, upper conductive layer and upper via conductors. A lower buildup layer is made up of the lower interlayer resin insulation layer, lower conductive layer and lower via conductors.

(18) Upper solder-resist layer (70F) having openings (71F) is formed on the upper buildup layer, and lower solder-resist layer (70S) having openings (71S) is formed on the lower buildup layer (FIG. 6(B)). Upper surfaces of conductive layers (58F, 58S) and via conductors (60F, 60S) exposed through openings (71F, 71S) work as pads (71FP, 71SP).

(19) Nickel-plated layer 72 is formed on the pads, and gold-plated layer 74 is further formed on nickel-plated layer 72 (FIG. 7(A)).

(20) Solder balls are loaded in openings (71F, 71S) and a reflow is performed so that solder bumps (76F) are formed on the upper buildup layer, and solder bumps (76S) are formed on the lower buildup layer. Printed wiring board 1 is completed (FIG. 7(B)).

In the method for manufacturing a printed wiring board according to the first embodiment, an intermediate body is formed on support sheet 10. Even when the thickness of one resin insulation layer is thin, bending or cracking does not occur in resin insulation layers and conductive layers of an intermediate body during transportation or the like. In addition, since the intermediate body includes two resin insulation layers and one conductive layer, the strength of the intermediate body is enhanced. Therefore, when an intermediate body is separated from the support sheet, warping or undulation is small in the intermediate body. Accordingly, the intermediate body is unlikely to be damaged even when it is processed or transported without a support sheet. The production yield and connection reliability of subsequent core substrates and printed wiring boards will improve. In addition, thin printed wiring boards will be produced efficiently. Buildup layers are formed without using a jig in the manufacturing method of the first embodiment. Fine conductive circuits are formed. In the first embodiment, it is preferred that the thicknesses of the first and second insulation layers each be 40 µm to 60 µm, and the thickness of the first conductive layer be 7 µm to 18 µm. A thin printed wiring board with less warping is obtained.

In the first embodiment, alignment mark (26T) is formed at the same time as conductive layer (26C). Based on the same alignment mark, a laser is used to form second opening (31F) from the first-surface (FF) side of the intermediate body while forming first opening (31S) from the second-surface (SS) side of the intermediate body. Since the first and second openings are formed using the same alignment mark, positional accuracy is high for first opening (31S) and second opening (31F), thus enhancing the connection reliability of a through-hole conductor.

Since a printed wiring board according to the first embodiment has excellent symmetrical features in a crosssectional direction, the printed wiring board is less likely to warp even when thermal stress is exerted thereon.

In a printed wiring board according to the first embodiment, the thicknesses of the first and second resin insulation layers of core substrate 30 are preferred to be greater than the thicknesses of the interlayer resin insulation layers of the buildup layers. Moreover, the thicknesses of the first and second resin insulation layers are preferred to be 30 μm to 60 μm each, whereas the thicknesses of interlayer resin insulation layers of the buildup layers are preferred to be 20 μm to 35 μm each. It is preferred that first and second resin insulation layers contain reinforcing material but that interlayer resin insulation layers of buildup layers not contain reinforcing material.

The thickness of the conductive layer interposed between the first and second resin insulation layers is preferred to be greater than the thickness of other conductive layers. The strength of an intermediate body and core substrate is enhanced. In addition, conductive layers of the upper and lower surfaces of a core substrate and conductive layers in buildup layers are formed with fine conductive circuits. For example, a printed wiring board with wiring at 8 μm/8 μm (line/space) or smaller is obtained. Since the printed wiring board is made thinner, warping is reduced. In the first embodiment, an intermediate body and core substrate are formed without using first and second metal foil. In such a case, a first insulation layer and a support sheet are bonded at fixed portions 14 on their periphery.

Second Embodiment

A method for manufacturing printed wiring board 1 of a second embodiment is shown in FIG. 8~FIG. 12.

(1) Support sheet 10 is a double-sided copper-clad laminate, the same as in the first embodiment. Copper foil 16 is bonded on copper foil 12 of the double-sided copper-clad laminate in the same manner as in the first embodiment (FIG. 8(A)). The matte surface of copper foil 16 faces upward the same as in the first embodiment.

(2) A plating resist is formed on copper foil 16. Second conductive layer (34S) is formed on copper foil 16 exposed from the plating resist. The plating resist is removed (FIG. 8(B)). Then, the same as in the first embodiment, B-stage resin film is laminated on copper foil 16 and on the second conductive layer. The resin film is cured, and first resin insulation layer (20S) is formed on metal foil 16 and on the second conductive layer. The second conductive layer is embedded in the first resin insulation layer (FIG. 8(C)).

(3) A laser is irradiated from the first-surface side of first resin insulation layer (20S). First opening (31S) reaching second conductive layer (34S) is formed in the first resin insulation layer (FIG. 9(A)). First opening (31S) tapers from the first surface of the first resin insulation layer toward second conductive layer (34S).

(4) Electroless plated film 24 is formed on the first surface of first resin insulation layer (20S) and on the inner wall of first opening (31S) (FIG. 9(B)).

(5) Plating resist 33 with a predetermined pattern is formed on electroless plated film 24 (FIG. 9(C)).

(6) Electrolytic plated film 32 is formed on electroless plated film 24 using the electroless plated film as a seed layer. First opening (31S) is filled with electrolytic plated film (FIG. 10(A)).

(7) The plating resist is removed, and electroless plated film 24 between portions of electrolytic plated film is removed. First via conductor (36S) is formed in first opening (31S), and first conductive layer (26C) is formed on the first surface of the first resin insulation layer (FIG. 10(B)). At the same time, alignment mark (226T) is formed. The first via conductor tapers from the first surface of the first resin insulation layer toward second conductive layer (34S). The diameter (bottom diameter) of a first via conductor on the second conductive layer is smaller than the diameter (top diameter) of the first via conductor on the first surface of the first resin insulation layer.

(8) Second resin insulation layer (20F) is formed on the first surface of the first resin insulation layer and on conductive layer (26C) (FIG. 10(C)).

(9) Treatments shown in FIG. 9(A)~FIG. 10(B) are repeated so that second via conductor (36F) is formed in second resin insulation layer (20F). In addition, third conductive layer (34F) is formed on the first surface of the second resin insulation layer. The same as in the first embodiment, through-hole conductor 36 is formed with conductive layer (26C) along with second via conductor (36F) and first via conductor (36S) sandwiching conductive layer (26C) (FIG. 11(A)). Intermediate body (30α) is completed on the support sheet. First conductive layer (26C) and the third conductive layer are connected by the second via conductor. The second via conductor tapers from the first surface of the second resin insulation layer toward conductive layer (26C). The diameter (bottom diameter) of a second via conductor on conductive layer (26C) is smaller than the diameter (top diameter) of the second via conductor on the first surface of the second resin insulation layer. The top diameter is the diameter on the side where a laser enters, whereas the bottom diameter is the diameter on the side where the laser reaches.

(10) The same as in the first embodiment, an intermediate body with a support sheet is cut off inside the fixed portions. Intermediate body (30α) is separated from support sheet 10 (FIG. 11(B)).

(11) Copper foil 16 on the second surface of first resin insulation layer (20S) is etched away, and core substrate 30 is completed (FIG. 11(C)). In a core substrate of the second embodiment, the second conductive layer is embedded in the second surface of the first resin insulation layer, and the third conductive layer is formed on the first surface of the second resin insulation layer. Accordingly, the thickness of a printed wiring board or a core substrate in the second embodiment is made thinner than the thickness of a printed wiring board or a core substrate in the first embodiment. In a core substrate of the second embodiment, via conductors formed in the first and second resin insulation layers are set to taper in the same direction. In addition, a conductive layer on one side of the core substrate is embedded in a resin insulation layer, while a conductive layer on the other side of the core substrate protrudes from a resin insulation layer. Therefore, warping is less in a core substrate and a printed wiring board in the second embodiment.

(12) The same treatments shown in FIG. 4(B)~FIG. 6(A) are performed on core substrate 30. Upper and lower buildup layers are formed on the core substrate. Then, the same as in the first embodiment, upper and lower solder-resist layers (70F, 70S) are formed (FIG. 12(A)). The material and thicknesses of insulation layers are the same in the first and second embodiments. Also, the thicknesses of first, second and third conductive layers are preferred to be 5-13 μm each in the first and second embodiments. The thicknesses of interlayer resin insulation layers and thicknesses of conductive layers of the buildup layers are the same in the first and second embodiments. The thicknesses of conductive layers in the buildup layers are 5-13 μm each.

(13) Next, nickel-plated layer 72 and gold-plated layer 74 are formed on the pads the same as in the first embodiment. Then, solder bumps (76F, 76S) are formed on the pads, the same as in the first embodiment. Printed wiring board 1 with solder bumps is completed (FIG. 12(B)). The first and second surfaces of each resin insulation layer are set the same in the second and first embodiments. Also, the contents described in the first embodiment apply to the second embodiment.

In the method for manufacturing a printed wiring board according to the second embodiment, an intermediate body is formed on a support sheet the same as in the first embodiment. Also, the support sheet is removed from the intermediate body, and a core substrate and a printed wiring board are manufactured from the intermediate body. Therefore, since an intermediate body contains multiple insulation layers and a conductive layer interposed between insulation layers in the second embodiment, the intermediate body has enhanced strength, the same as in the first embodiment. Accordingly, such an intermediate body is processed without a support sheet. The second embodiment exhibits the same effects as the first embodiment.

A method for manufacturing a printed wiring board according to one aspect of the present invention includes the following: preparing a support sheet; on the support sheet, forming a first insulation layer having a first surface and a second surface in such a way that the second surface of the first insulation layer faces the support sheet; on the first surface of the first insulation layer, forming a first conductive layer; on the first surface of the first insulation layer and on the first conductive layer, forming a second insulation layer having a first surface and a second surface in such a way that the second surface of the second insulation layer faces the first insulation layer; separating the support sheet from the first insulation layer; forming a first opening which penetrates through the first insulation layer and reaches the first conductive layer; forming a second opening which penetrates through the second insulation layer and reaches the first conductive layer; on the second surface of the first insulation layer, forming a second conductive layer; on the first surface of the second insulation layer, forming a third conductive layer; in the first opening, forming a first via conductor which connects the first conductive layer and the second conductive layer; and in the second opening, forming a second via conductor which connects the first conductive layer and the third conductive layer.

A method for manufacturing a printed wiring board according to another aspect of the present invention includes the following: forming a second conductive layer on a support sheet; on the support sheet and on the second conductive layer, forming a first insulation layer having a first surface and a second surface in such a way that the second surface of the first insulation layer faces the support sheet; on the first surface of the first insulation layer, forming a first conductive layer; in the first insulation layer, forming a first via conductor which penetrates through the first insulation layer and connects the first conductive layer and the second conductive layer; on the first surface of the first insulation layer and on the first conductive layer, forming a second insulation layer having a first surface and a second surface in such a way that the second surface of the second insulation layer faces the first insulation layer; on the first surface of the second insulation layer, forming a third conductive layer; in the second insulation layer, forming a second via conductor which penetrates through the second insulation layer and connects the first conductive layer and the third conductive layer; and separating the second conductive layer and the first insulation layer from the support sheet.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   forming on a support sheet an intermediate body comprising a first insulation layer, a second insulation layer and a first conductive layer interposed between the first insulation layer and the second insulation layer;
   separating the support sheet from the intermediate body comprising the first insulation layer, the first conductive layer and the second insulation layer such that the intermediate body is detached from the support sheet;
   forming a first opening portion in the first insulation layer such that the first opening portion penetrates through the first insulation layer and reaches the first conductive layer;
   forming a second opening portion in the second insulation layer such that the second opening portion penetrates through the second insulation layer and reaches the first conductive layer;
   forming a second conductive layer on the first insulation layer;
   forming a third conductive layer on the second insulation layer;
   forming a first via conductor in the first opening portion such that the first via conductor connects the first conductive layer and the second conductive layer; and
   forming a second via conductor in the second opening portion such that the second via conductor connects the first conductive layer and the third conductive layer,
   wherein the forming of the intermediate body includes forming the first insulation layer on the support sheet, forming the first conductive layer on the first insulation layer, and forming the second insulation layer on the first insulation layer and the first conductive layer such that the intermediate body comprising the first insulation layer, the second insulation layer and the first conductive layer interposed between the first insulation layer and the second insulation layer is formed.

2. The method for manufacturing a printed wiring board according to claim 1, further comprising:
   laminating a first metal foil on the support sheet prior to the forming of the first insulation layer on the support sheet; and
   laminating a second metal foil on the second insulation layer,
   wherein the forming of the first insulation layer comprises forming the first insulation layer such that the first metal foil is interposed between the first insulation layer and the support sheet.

3. The method for manufacturing a printed wiring board according to claim 2, wherein the separating of the support sheet comprises separating the support sheet from the intermediate body comprising the first metal foil, the first insulation layer, the first conductive layer and the second insulation layer such that the intermediate body is detached from the support sheet.

4. The method for manufacturing a printed wiring board according to claim 3, wherein the support sheet is a copper-clad laminate, and the laminating of the first metal foil includes ultrasonic bonding the copper-clad laminate and the first metal foil such that a bonding portion fixing the copper-clad laminate and the first metal foil is formed.

5. The method for manufacturing a printed wiring board according to claim 4, wherein the separating of the intermediate body includes cutting the intermediate body and the support sheet such that the bonding portion fixing the copper-clad laminate and the first metal foil is removed.

6. The method for manufacturing a printed wiring board according to claim 3, further comprising:
forming a first buildup layer on the first insulation layer and the second conductive layer; and
forming a second buildup layer on the second insulation layer and the third conductive layer.

7. The method for manufacturing a printed wiring board according to claim 3, wherein the forming of the first conductive layer includes forming an alignment mark positioned for the forming of the first opening portion.

8. The method for manufacturing a printed wiring board according to claim 7, wherein the forming of the first conductive layer includes forming an alignment mark positioned for the forming of the second opening portion.

9. The method for manufacturing a printed wiring board according to claim 2, wherein the support sheet is a copper-clad laminate, and the laminating of the first metal foil includes ultrasonic bonding the copper-clad laminate and the first metal foil such that a bonding portion fixing the copper-clad laminate and the first metal foil is formed.

10. The method for manufacturing a printed wiring board according to claim 9, wherein the separating of the intermediate body includes cutting the intermediate body and the support sheet such that the bonding portion fixing the copper-clad laminate and the first metal foil is removed.

11. The method for manufacturing a printed wiring board according to claim 2, further comprising:
forming a first buildup layer on the first insulation layer and the second conductive layer; and
forming a second buildup layer on the second insulation layer and the third conductive layer.

12. The method for manufacturing a printed wiring board according to claim 9, wherein the forming of the first conductive layer includes forming an alignment mark positioned for the forming of the first opening portion.

13. The method for manufacturing a printed wiring board according to claim 12, wherein the forming of the first conductive layer includes forming an alignment mark positioned for the forming of the second opening portion.

14. The method for manufacturing a printed wiring board according to claim 2, wherein the forming of the first conductive layer includes forming an alignment mark positioned for the forming of the first opening portion and the forming of the second opening portion.

15. The method for manufacturing a printed wiring board according to claim 1, further comprising:
forming a first buildup layer on the first insulation layer and the second conductive layer; and
forming a second buildup layer on the second insulation layer and the third conductive layer.

16. The method for manufacturing a printed wiring board according to claim 15, wherein the support sheet is a copper-clad laminate, and the laminating of the first metal foil includes ultrasonic bonding the copper-clad laminate and the first metal foil such that a bonding portion fixing the copper-clad laminate and the first metal foil is formed.

17. The method for manufacturing a printed wiring board according to claim 16, wherein the separating of the intermediate body includes cutting the intermediate body and the support sheet such that the bonding portion fixing the copper-clad laminate and the first metal foil is removed.

18. The method for manufacturing a printed wiring board according to claim 1, wherein the forming of the first conductive layer includes forming an alignment mark positioned for the forming of the first opening portion.

19. The method for manufacturing a printed wiring board according to claim 18, wherein the forming of the first conductive layer includes forming an alignment mark positioned for the forming of the second opening portion.

20. The method for manufacturing a printed wiring board according to claim 1, wherein the forming of the first conductive layer includes forming an alignment mark positioned for the forming of the first opening portion and the forming of the second opening portion.

* * * * *